(12) United States Patent
Lindner et al.

(10) Patent No.: US 11,239,009 B2
(45) Date of Patent: Feb. 1, 2022

(54) POWER RESISTOR

(71) Applicant: EBG Elektronische Bauelemente GmbH, Laakirchen (AT)

(72) Inventors: Christian Rene Lindner, Paldau (AT); Josef Praschk, Kirchbach in der Steiermark (AT)

(73) Assignee: EBG Elektronische Bauelemente GmbH, Laakirchen (AT)

( * ) Notice: Subject to any disclaimer, the term of this patent is extended or adjusted under 35 U.S.C. 154(b) by 0 days.

(21) Appl. No.: 16/614,036

(22) PCT Filed: May 15, 2018

(86) PCT No.: PCT/EP2018/062630
§ 371 (c)(1),
(2) Date: Jan. 7, 2020

(87) PCT Pub. No.: WO2018/210888
PCT Pub. Date: Nov. 22, 2018

(65) Prior Publication Data
US 2020/0176153 A1    Jun. 4, 2020

(30) Foreign Application Priority Data
May 15, 2017    (EP) .................................... 17171188

(51) Int. Cl.
*H01C 1/144*    (2006.01)
*H01C 1/01*    (2006.01)
(Continued)

(52) U.S. Cl.
CPC ............. *H01C 1/144* (2013.01); *H01C 1/01* (2013.01); *H01C 1/024* (2013.01); *H01C 1/084* (2013.01); *H01R 12/585* (2013.01)

(58) Field of Classification Search
CPC ........ H01C 1/144; H01C 1/024; H01R 12/585
See application file for complete search history.

(56) References Cited

U.S. PATENT DOCUMENTS

| 4,183,136 A | 1/1980 | Colla |
| 5,451,174 A | 9/1995 | Bogursky et al. |
| 6,200,156 B1 * | 3/2001 | Hiraki .................... H01C 13/00 338/160 |

FOREIGN PATENT DOCUMENTS

| DE | 2347049 A1 | 2/1975 |
| DE | 3715860 A1 | 1/1988 |

(Continued)

*Primary Examiner* — Kyung S Lee

(57) ABSTRACT

A power resistor is disclosed, having at least one electrical connection, having a carrier substrate, which has at least one resistor element composed of a thick-film material and at least one contact electrode to which the resistor element electrically connects, having at least one electrical conductor, which is soldered to the contact electrode and produces an electrical connection between the contact electrode and the electrical terminal, and having a housing, which is at least partially filled with at least one casting compound and in which the resistor element and contact electrode are encapsulated, with the electrical conductor protruding out through the casting compound. In order to achieve a simply designed and easy-to-use power resistor, it is proposed for a pin, in particular a soldering pin or press-fitting pin, to constitute the electrical conductor, which pin is placed onto the contact electrode and soldered to it and constitutes the electrical terminal of the power resistor.

15 Claims, 3 Drawing Sheets

(51) Int. Cl.
*H01C 1/024* (2006.01)
*H01C 1/084* (2006.01)
*H01R 12/58* (2011.01)

(56) References Cited

FOREIGN PATENT DOCUMENTS

| | | |
|---|---|---|
| DE | 9217269 U1 | 2/1993 |
| EP | 0963143 A1 | 12/1999 |
| EP | 3093856 A1 | 11/2016 |
| FR | 2713396 A1 | 6/1995 |
| JP | H02238601 A | 9/1990 |
| JP | 2005032912 A | 2/2005 |
| JP | 2016139732 A | 8/2016 |

* cited by examiner

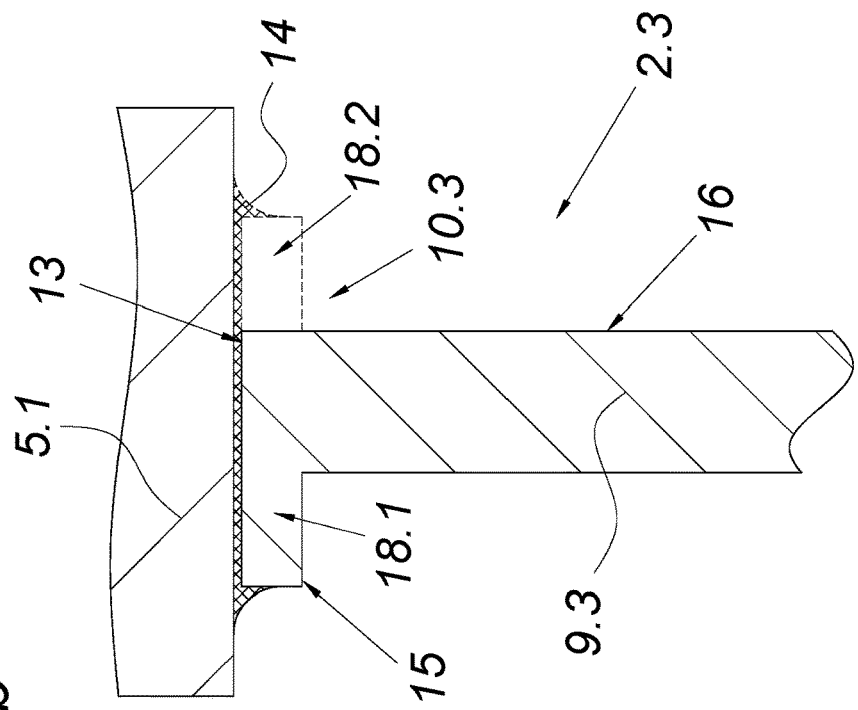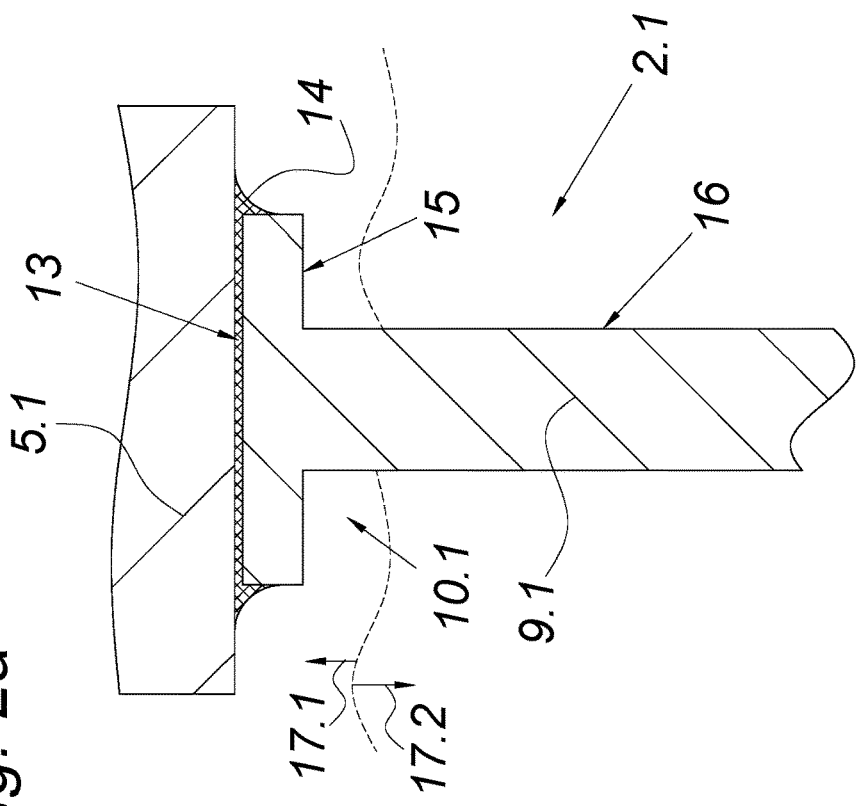

POWER RESISTOR

FIELD OF THE INVENTION

The invention relates to a power resistor having at least one electrical connection, having a carrier substrate, which has at least one resistor element composed of a thick-film material and at least one contact electrode to which the resistor element electrically connects, having at least one electrical conductor, which is soldered to the contact electrode and produces an electrical connection between the contact electrode and the electrical terminal, and having a housing, which is at least partially filled with at least one casting compound and in which the resistor element and contact electrode are encapsulated, with the electrical conductor protruding out through the casting compound.

BACKGROUND OF THE INVENTION

In order to produce an electrical connection between the terminals of a power resistor and the resistor element on a ceramic carrier substrate in the encapsulated housing of the high-powered resistor, it is known (DE3715860A1) to provide flexible electrical conductors. These conductors are each soldered at one end to an electrode of the layer film resistor and fastened at the other end to an electrical terminal, which is embodied in the form of a cable lug. Such an electrical connection disadvantageously requires a comparatively high production cost.

In addition, plug connections embodied in this way require a durable mechanical connection to the housing and therefore costly mechanical securing measures in order to withstand both mounting forces in the electrical connection of the power resistor and thermal expansion so as to ensure the electrical contact with the electrical conductor.

The features of the preamble are known from U.S. Pat. No. 3,093,856 A1. A bonding wire is disadvantageously required between the electrical conductor and the contact electrode, which results in an elevated design cost for the power resistor and can also negatively affect the durability of the power resistor when it comes to receiving high levels of electrical power.

SUMMARY OF THE INVENTION

The object of the invention, therefore, is to modify a power resistor of the type described at the beginning in such a way that while simple in design, is able to achieve an increased durability of the power resistor.

The invention attains the stated object in that a pin, in particular a soldering pin or press-fitting pin, constitutes the electrical conductor, which pin is placed onto the contact electrode and soldered to it and constitutes the electrical terminal of the power resistor.

A significant design simplification in the electrical connection of the electrode on the carrier substrate to the terminal on the power resistor can be achieved if a pin, in particular a soldering pin or press-fitting pin, constitutes the electrical conductor, which pin is placed onto the contact electrode and soldered to it and constitutes the electrical terminal of the power resistor.

According to the invention, the electrical conductor thus also serves as an electrical terminal on the power resistor—which makes it unnecessary to provide a fixed electrical contact point between the conductor and the terminal in the way that is known from the prior art in order to produce the electrical connection between the electrode and the terminal. This can eliminate the danger of a circuit break at the above-mentioned contact point—and can thus contribute to increasing the durability of the power resistor, in particular, thermal expansion effects can be absorbed by the pin and removed from the power resistor.

The mechanical loads acting on the terminal can then be readily absorbed and thus removed from the carrier substrate by the soldered connection of the pin, which is positioned on the electrode, without having to reckon with a circuit break in the electrical connection between the contact electrode and the terminal. In addition, the casting compound through which the pin protrudes can also contribute to the mechanical stability of the terminal.

The design simplification of the power resistor with the aid of a pin can therefore also further increase the durability of the power resistor. It is thus possible to produce a durable, easy-to-use, and securely connecting power resistor.

The latter can be further improved if the pin is embodied as a press-fitting pin and it is thus possible to produce an electrical connection by means of frictional engagement at the terminal of the resistor element.

If at its first end, the pin has a flat end surface that is placed onto the contact electrode and soldered to it, then it is possible to further improve the electrical and mechanical properties of the fixed electrical contact. It is thus possible, among other things, to avoid notch effects between the press-fitting pin and the electrode, both during the integrally bonded soldering and when mechanical loads are exerted, thus reducing the danger of a sporadic weakening of the fixed electrical contact.

The electrical and mechanical contact between the electrode and the press-fitting pin can be enlarged if at its first end, the press-fitting pin has a protruding mounting head. This mounting head can be embodied in the form of a foot, which results for example in an L-shaped press-fitting pin, or in the form of a circumferentially protruding one, which results for example in a T-shaped press-fitting pin.

If the mounting head protrudes circumferentially, then for example mechanical loads acting on the carrier substrate can be uniformly removed regardless of the direction. It is thus possible to further improve the durability of the power resistor. The latter can be achieved particularly if the mounting head protrudes circumferentially in circular fashion and it is thus possible to absorb mechanical loads regardless of the direction.

Alternatively to a circumferential protrusion, the mounting head can have at least one soldering foot so that it can be provided on a comparatively narrow contact electrode. If the pin has two soldering feet, then this can change it from an L-shaped embodiment to a T-shaped embodiment on the pin.

In a simply designed solution, the contact surface can be enlarged by having the protruding mounting head constitute the flat end surface.

Preferably, a plurality of contact electrodes is provided on the carrier substrate, each with at least one soldered-on pin, with two contact electrodes being electrically connected to a respective resistor element. It is thus possible to make use of the same advantages according to the invention for both connections of the resistor element.

If the pin, which is embodied as a press-fitting pin, constitutes the electrical terminal with its press-fitting head, then a reliable option for connecting to the power resistor can be achieved—which can also facilitate the installation of the power resistor.

If the press-fitting head protrudes from the housing, then it is possible to further facilitate the installation of the resistor element because of the electrical terminal that is freely accessible relative to the housing.

Preferably, the housing has an open broad side in order to enable it to be used as a mold for the casting compound. The production of the resistor element can thus be facilitated and its costs can be reduced.

The cooling of the resistor element and thus its reliability and durability can be improved if the carrier substrate is provided on a second broad side of the housing—particularly if the carrier substrate constitutes this broad side of the housing.

The design of the resistor element can be further simplified if it is provided on a plate-shaped carrier substrate made of a ceramic-like material.

Preferably, the casting compound can be multilayered, a first layer material of which is silicone-based or composed of a silicone material and encapsulates the resistor element, and the pin protrudes through a second epoxy resin-based layer material, in order to thus optimize the mechanical strength and the electrical durability of the power resistor.

The electrical and mechanical connection of the pin to the contact electrode can be embodied more durably if the first layer material, which is silicone-based, encapsulates the mounting head of the pin.

Preferably, the second layer material is positioned on the first layer material, which simplifies the design of the power resistor and also facilitates the casting and production thereof.

In general, it should be noted that the resistor element can be a thick-film resistor. Such a resistor element can, for example, be embodied by applying ruthenium-based resistor pastes, cermet, etc. to the carrier substrate.

In general, it should also be noted that a contact electrode for electrically connecting a resistor element can have a thick-film past made of AgPd, AgPt, etc.

It should also be generally noted that the electrically insulating carrier substrate is preferably plate-shaped. This carrier substrate can contain or consist of ceramic and/or a ceramic-like material, preferably aluminum oxide ceramic, etc. The carrier substrate can also be composed of a composite material containing a ceramic and/or a ceramic-like material, for example with two outer ceramic plates and a metal plate in the middle.

BRIEF DESCRIPTION OF THE DRAWINGS

The subject of the invention is shown in greater detail in the figures by way of example based on an embodiment variant. In the drawings:

FIGS. 2a and 2b show enlarged details from FIG. 1.

DETAILED DESCRIPTION OF THE PREFERRED EMBODIMENTS

Figure 1:
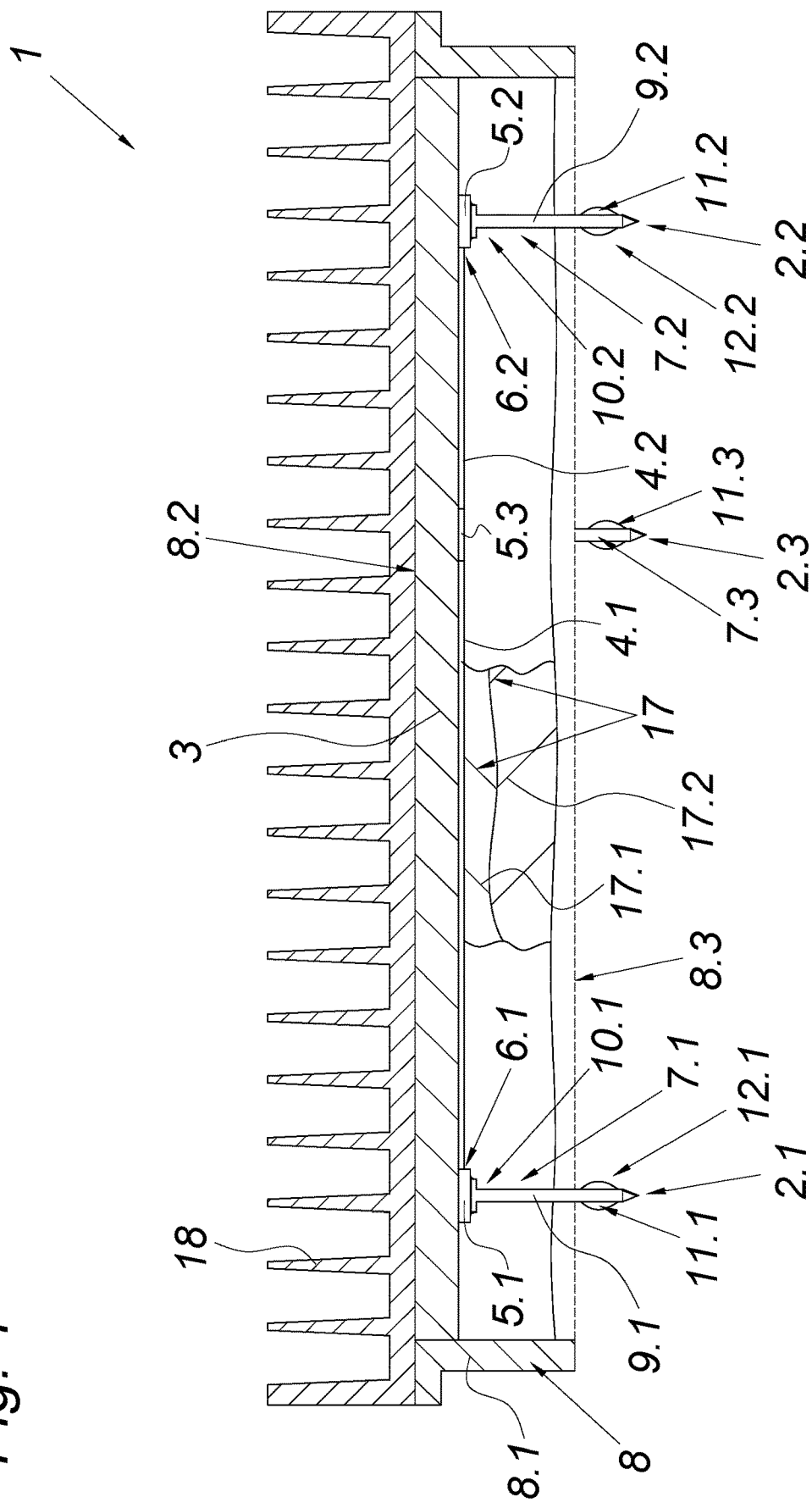
FIG. 1 shows a sectional view of a resistor element.
Figure 3:
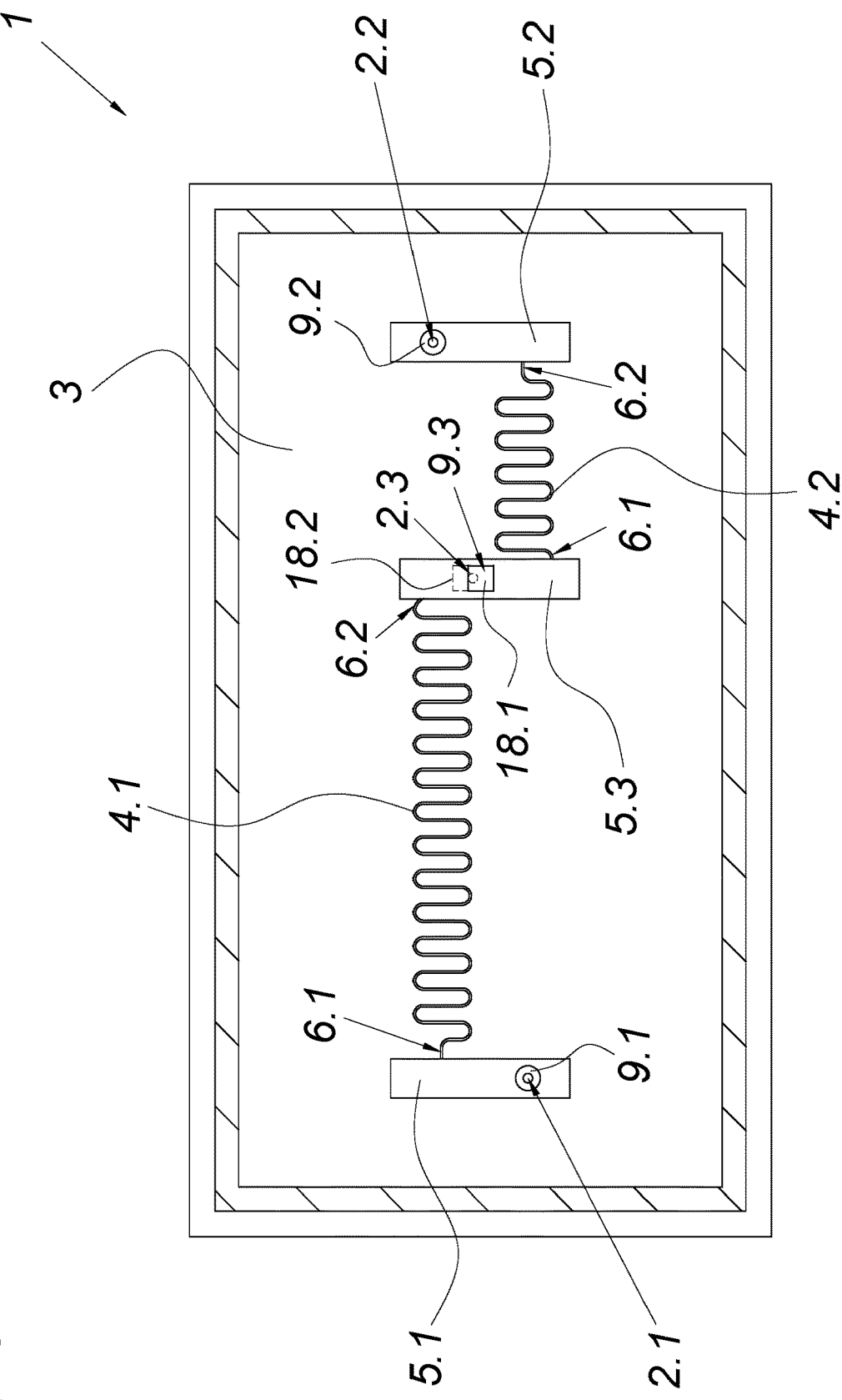
FIG. 3 shows a partially cut-away top view of the resistor element shown in FIG. 1.

The power resistor 1 that is shown by way of example in FIGS. 1, 2a, and 2b has three electrical terminals 2.1, 2.2, 2.3, which constitute the main connection or power connection of the power resistor 1. In general, however, it is also conceivable for the electrical terminals 2.1, 2.2, 2.3 to serve other purposes—for example for transmitting sensor signals from the power resistor 1 etc., but this is not shown.

The power resistor 1 also has a plate-shaped carrier substrate 3 made of an electrically insulating material, for example a ceramic-like material, which can also be aluminum oxide ceramic. The carrier substrate 3 can be embodied of one layer or as multilayered.

On the carrier substrate 3, several resistor elements 4.1, 4.2 composed of a thick-film material are provided, which are electrically connected in series and together constitute the resistor of the power resistor 1. The carrier substrate 3 also functions as a heat conductor for cooling the resistor elements 4.1, 4.2.

The two resistor elements 4.1, 4.2 are positioned electrically between two contact electrodes 5.1, 5.2, 5.3, which are each electrically connected to the respective ends 6.1 and 6.2 of the resistor elements 4.1 and 4.2. In addition, three electrical conductors 7.1, 7.2, 7.3 are provided, which are each soldered to the respective contact electrode 5.1, 5.2, 5.3 and each produce an electrical connection between the contact electrode 5.1, 5.2, 5.3 and the electrical terminals 2.1, 2.2, 2.3.

The resistor elements 4.1, 4.2 and the contact electrodes 5.1, 5.2, 5.3 are accommodated in a housing 8 and are thus protected from mechanical damage.

According to the invention, the electrical conductors 7.1, 7.2, 7.3 are each embodied in the form of a pin 9.1, 9.2, 9.3, namely a press-fitting pin. The pins 9.1, 9.2, 9.3 are each placed with a first end 10.1, 10.2, 10.3 onto the respective contact electrode 5.1, 5.2, 5.3 and soldered to it in order to produce a mechanical and electrical connection. At the other end 11.1, 11.2, 11.3, the press-fitting head 11.1, 11.2, 11.3 of the respective pin 9.1, 9.2, 9.3 constitutes the electrical terminal 2.1, 2.2, 2.3. This achieves a simply designed solution for enabling a durable electrical connection between the contact electrode 5.1, 5.2, 5.3 and the terminal 2.1, 2.2, 2.3. It is also conceivable, however, for the pin 9.1, 9.2, 9.3 to be embodied in the form of a soldering pin, i.e. a pin without a press-fitting head, but this has not been depicted in detail.

As can be seen in FIG. 2a in a detail of the pin 9.1, which serves as an example for all of the other pins 9.2 and 9.3, these pins 9.1 each have a flat end surface 13 at a first end 10.1. These flat end surfaces 13 of the pins 9.1, 9.2, 9.3 are placed onto the respective contact electrode 5.1, 5.2, 5.3 and soldered to it, as is clear from the solder cone 14 shown in exaggerated fashion surrounding the end surface 13. The flat end surfaces 13 are each located on the respective mounting head 15 of the pins 9.1, 9.2, 9.3.

In the outer pins 9.1, 9.2 according to FIG. 2a, the mounting head 15 protrudes circumferentially in circular fashion relative to the pin shaft 16, which enlarges the end surface 13. This results in a mechanically and electrically improved fixed contact between the contact electrode 5.1, 5.2 and the respective pin 9.1, 9.2—which increases the durability of the power resistor 1.

This is similarly the case in the middle pin 9.3 shown in FIG. 2b, but its mounting head 15 is embodied differently. Here, strut-shaped soldering foot 18.1 protrudes from it, resulting in an L-shaped pin 9.3, which can be provided, even in the case of a narrow contact electrode 5.3. The same is true in the event that two diametrically opposing strut-shaped soldering feet 18.1, 18.2 are provided, as shown with dashed lines in FIG. 2, which therefore results in a T-shaped pin 9.3.

The design of the power resistor 1 is achieved with a comparatively simple solution in that the housing 8 is formed by a closed side wall 8.1 and the carrier substrate 3, which constitutes a section of the second broad side 8.2. A cooling body 19 can therefore be provided on the carrier substrate 3. Among other things, it is thus possible to provide the power resistor 1 with particularly good cooling despite the presence of the casting compound 17.

The first broad side 8.3, for example the bottom of the housing 8, is open and provides a clear view of a casting compound 17, which—poured into the housing 8—encapsulates the resistor element 4.1, 4.2 and contact electrode 5.1, 5.2, 5.3.

It is clear from FIGS. 1 and 2a that the casting compound 17 has different material layers, preferably placed on top of each other, and is thus embodied as multilayered. In FIG. 2a, the transition between the two layer materials 17.1, 17.2 is depicted with a dashed line. The resistor element 4.1, 4.2 and the contact electrode 5.1, 5.2, 5.3 are thus encapsulated in the first layer material 17.1, which is silicone-based or is composed of a silicone material. The second layer material 17.2, which is resin-based or polyurethane-based layer material or the like, is provided on this first layer material 17.1. The first layer material 17.1 can elastically encapsulate the resistor element 4.1, 4.2 and the contact electrode 5.1, 5.2, 5.3 and the second layer increases the strength of the encapsulation. In addition, the silicone-based first layer material 17.1 also encapsulates the mounting head 15 of the pin 9.1, 9.2, 9.3.

The press-fitting pins 9.1, 9.2 protrude through this casting compound 17. The press-fitting heads 11.2, 11.2, 11.3 protrude from the housing 8, thus permitting the power resistor 1 to be easily mounted and electrically connected.

The invention claimed is:

1. A power resistor comprising:
    at least one electrical terminal;
    a carrier substrate, which has at least one resistor element composed of a thick-film material and at least one contact electrode to which the resistor element electrically connects;
    at least one electrical conductor, which is soldered to the at least one contact electrode and produces an electrical connection between the at least one contact electrode and the at least one electrical terminal; and
    a housing, which is at least partially filled with at least one casting compound and in which the at least one resistor element and the at least one contact electrode are encapsulated, with the at least one electrical conductor protruding out through the at least one casting compound, wherein a pin, in particular a soldering pin or press fitting pin, constitutes the electrical conductor, which pin constitutes the at least one electrical terminal of the power resistor and is placed onto the at least one contact electrode and soldered to the at least one contact electrode, such that mechanical loads acting on the at least one electrical terminal can be readily absorbed and thus removed from the carrier substrate.

2. The power resistor according to claim 1, wherein at its a first end, the pin has a flat end surface that is placed onto the at least one contact electrode and soldered to the at least one contact electrode.

3. The power resistor according to claim 1, wherein at a first end, the pin has a protruding mounting head.

4. The power resistor according to claim 3, wherein the mounting head protrudes circumferentially, especially in circular fashion.

5. The power resistor according to claim 3, wherein the mounting head has at least one soldering foot.

6. The power resistor according to claim 3, wherein the mounting head constitutes a flat end surface.

7. The power resistor according to claim 1, comprising a plurality of the contact electrodes on the carrier substrate, each of the contact electrodes having at least one soldered-on pin, with two of the contact electrodes being electrically connected to a respective resistor element.

8. The power resistor according to claim 1, wherein the pin, which is embodied as a press-fitting pin, constitutes the at least one electrical terminal with its press-fitting head.

9. The power resistor according to claim 8, wherein the press-fitting head protrudes from the housing.

10. The power resistor according to claim 1, wherein the housing is a mold for the at least one casting compound and has a first open broad side.

11. The power resistor according to claim 10, wherein the carrier substrate is provided on a second broad side of the housing.

12. The power resistor according to claim 1, wherein the at least one resistor element is provided on a plate-shaped carrier substrate made of a ceramic-like material.

13. The power resistor according to claim 1, wherein the at least one casting compound is multilayered, a first layer material of which is silicone-based or composed of a silicone material and encapsulates the at least one resistor element, and the pin protrudes through a second epoxy resin-based or polyurethane-based layer material.

14. The power resistor according to claim 13, wherein the first layer material, which is silicone-based or composed of a silicone material, encapsulates a mounting head of the pin.

15. The power resistor according to claim 13, wherein the second layer material is positioned on the first layer material.

* * * * *